(12) United States Patent
Festag et al.

(10) Patent No.: US 7,248,469 B2
(45) Date of Patent: Jul. 24, 2007

(54) PLUG-IN ELECTRONIC MODULE AND METHOD FOR CONNECTING A PLUG-IN ELECTRONIC MODULE TO A HOLDING STRUCTURE

(75) Inventors: Mario Festag, Berlin (DE); Uwe Fischer, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 215 days.

(21) Appl. No.: 10/656,601

(22) Filed: Sep. 5, 2003

(65) Prior Publication Data

US 2005/0052842 A1   Mar. 10, 2005

(51) Int. Cl.
   *G06F 1/16*   (2006.01)
(52) U.S. Cl. ........................ 361/686; 361/736
(58) Field of Classification Search ................ 361/752, 361/797, 800, 796, 785, 686, 683, 788
See application file for complete search history.

(56) References Cited

U.S. PATENT DOCUMENTS 6,134,082 A * 10/2000 Uwabo et al. .............. 360/133
6,480,390 B2 * 11/2002 Matsumiya et al. ........ 361/736
6,857,791 B2 *  2/2005 Fischer et al. ................ 385/92

* cited by examiner

*Primary Examiner*—Dean A. Reichard
*Assistant Examiner*—Ivan Carpio
(74) *Attorney, Agent, or Firm*—Workman Nydegger (57) ABSTRACT

The present invention relates to a plug-in electronic module which has: a housing, an electronic component arranged in the housing, at least one external electrical contact connected to the electronic component, where the electronic module can be plugged into a holding structure such that the external electrical contacts on the module come into contact with associated electrical contacts on a coupling partner during the plug-in operation, and a mechanical protective apparatus which protects the electrical contacts from mechanical contact when the module is not plugged in and which exposes the electrical contacts when the module has been plugged into the holding structure, so that they can come into contact with associated electrical contacts on the coupling partner. The invention also relates to a method for connecting such an electronic module to a holding structure.

25 Claims, 10 Drawing Sheets

PLUG-IN ELECTRONIC MODULE AND METHOD FOR CONNECTING A PLUG-IN ELECTRONIC MODULE TO A HOLDING STRUCTURE

BACKGROUND OF THE INVENTION

Field of the Invention

The invention relates to a plug-in electronic module and to a method for connecting a plug-in electronic module to a holding structure. It is used particularly for plug-in optoelectronic transceivers which are plugged into a housing arranged on a printed circuit board, in the course of which electrical contacts on an electronic circuit in the transceiver come into electrical contact with associated contacts on a connector arranged on the printed circuit board.

It is known practice to arrange optoelectronic transceivers on a printed circuit board such that they can be plugged in. In particular, plug-in "small form factor pluggable" (SFP) transceivers of small dimensions are known which are arranged in a housing on a printed circuit board.

Figure 8A:
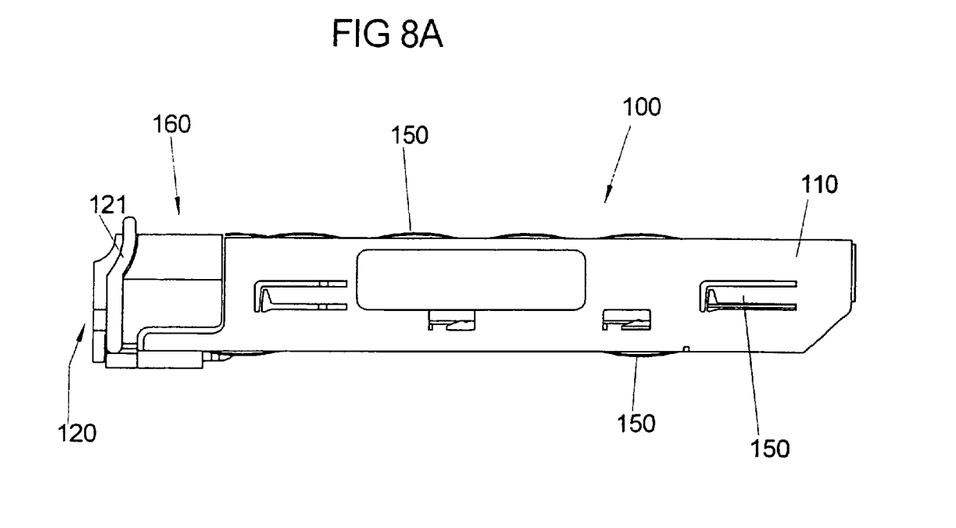
FIG. 8a shows an electronic module known from the prior art in side view.
Figure 8B:
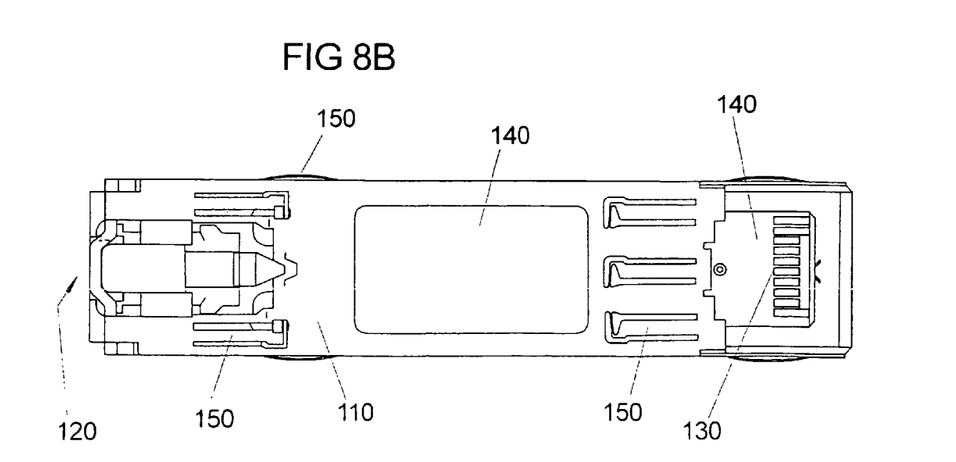
FIG. 8b shows the electronic module from FIG. 8a in a view from below.

A plug-in transceiver of small dimensions which is known in the prior art is shown in FIGS. 8a and 8b. Such a transceiver 100 normally has a housing 110 which contains, on a printed circuit board 140, electrical and optoelectronic components, particularly a transmission module such as a VCSEL laser and a reception module such as a photodiode, in a manner which is known per se. Light is injected and output between the optoelectronic transceiver 100 and an optical network via a plug holder 160 which is arranged in the region of one end of the housing 110.

To lock and unlock the transceiver in a housing into which the transceiver is plugged, a locking apparatus 120 is provided which can be in diverse forms and, by way of example, has a pivotable clip 121.

In addition, as FIGS. 8a and 8b show, resilient bulges 150 can be formed on the housing 110 which allow the transceiver to be mounted without play in an associated housing. In this case, provision can be made for the bulges 150 to be made of metal and to be connected to metal structures inside the transceiver, for example an internal shielding plate, so that the internal metal structures can be put at a particular electrical potential.

Formed on the underside of the printed circuit board 140 is a series of external electrical contacts 130 which are used for making contact with the electrical printed circuit board 140 or with the electrical and optoelectronic components arranged on the printed circuit board 140. These contacts 130 can be in the form of metal contact areas, but can likewise be in the form of electrical connection pins which are plugged into a connector.

Figure 9:
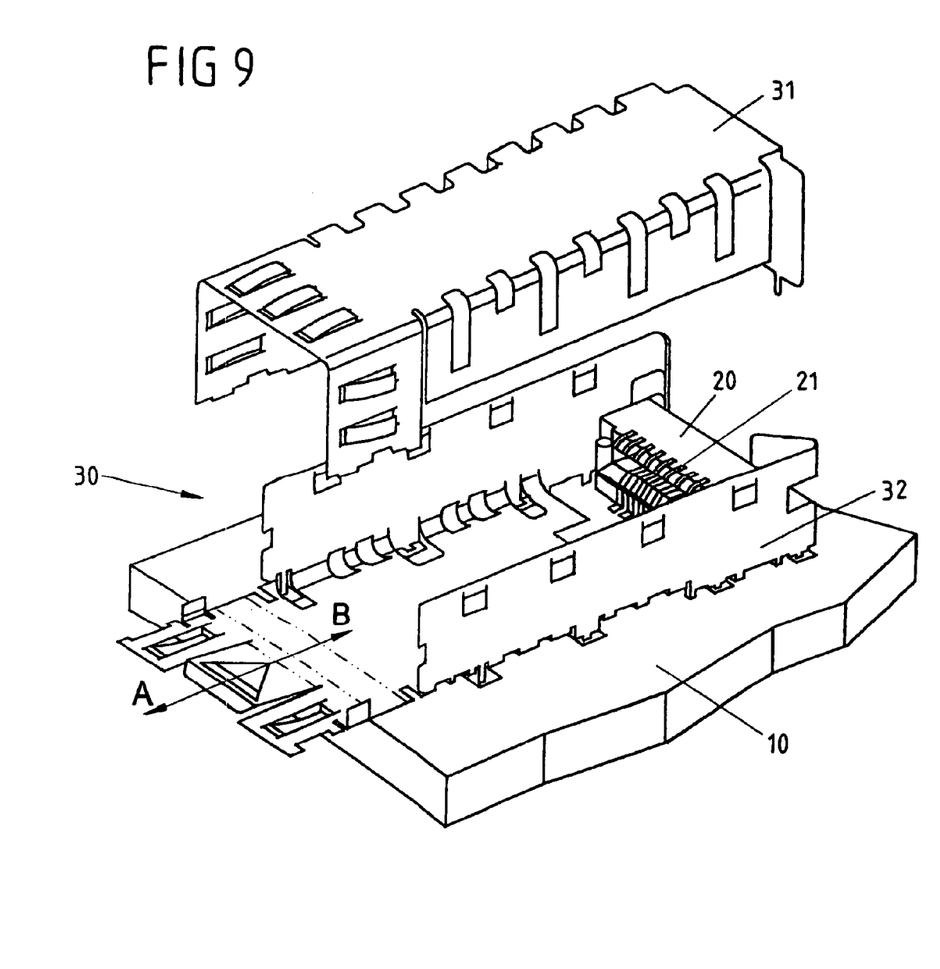
FIG. 9 shows a housing, known from the prior art, for holding an electronic module.

The aforementioned aspects become clearer when consideration is also given to the housing or the holding apparatus into which the transceiver 100 can be plugged. Such a housing 30, which is preferably metal, is shown in FIG. 9. In the exemplary embodiment shown, the housing 30 comprises a top housing part 31 and a bottom housing part 32, but can also be of integral design in principle. The two housing parts 31, 32 are connected to one another when the housing 30 has been fully assembled. The interior of the housing 30 contains an electrical connector 20 which, like the housing 30, is arranged on an electrical printed circuit board 10. The electrical printed circuit board 10 is used to make the electrical contact for a multiplicity of electrical contacts 21 on the electrical connector 20.

When the transceiver 100 is plugged into the housing 30 along the arrow direction A-B, the electrical contacts 130 on the transceiver 100 come into contact with associated contacts 21 on the electrical connector 20, as a result of which the electrical and optoelectronic components arranged on the transceiver's printed circuit board 140 are electrically connected to the printed circuit board 10, so that radio-frequency information signals can be applied, for example.

The problem is now that the electrical contacts 130 on the transceiver or, generally, on an electronic module having electrical contacts need to be protected from electrostatic discharges which can occur when the transceiver is in the unplugged state, for example as a result of discharges of static electricity when touched by an operator who is handling the transceiver. Such static discharges can result in damage to and in failure of electronic circuits and parts of the transceiver.

In this context, it will be pointed out that the standard IEC 61000-4-2 makes particular provisions regarding protection of electronic parts from static discharges when two bodies having different electrostatic potentials move together and make direct contact.

SUMMARY OF THE INVENTION

The present invention is based on the object of providing a plug-in electronic module and a method for connecting a plug-in electronic module having a holding structure which protect the electrical contacts and electronic components of the module from electrostatic discharges in the unplugged state.

The present invention achieves this object by providing a plug-in electronic module which has: a housing, an electronic component arranged in the housing, and at least one external electrical contact connected to the electronic component. The electronic module can be plugged into a holding structure such that the external electrical contacts on the module come into contact with associated electrical contacts on a coupling partner during the plug-in operation. The plug-in electronic module also includes a mechanical protective apparatus which protects the electrical contacts from mechanical contact when the module is not plugged in and which exposes the electrical contacts when the module has been plugged into the holding structure, so that they can come into contact with associated electrical contacts on the coupling partner.

The inventive solution achieves mechanical protection for the electrical contacts on the module in the unplugged state by virtue of the mechanical protective apparatus, which means that these contacts are protected particularly from unwanted, inadvertent contact. When the module is plugged into a holding structure, on the other hand, the mechanical protective apparatus automatically exposes the electrical contacts, so that electrical coupling with a coupling partner can take place.

An electronic component of the module can be, by way of example, an electrical chip arranged on a printed circuit board in the module or an optoelectronic component such as an optical transmission module or an optical reception module. The holding structure which holds the electronic part is a holding housing arranged on a circuit board, for example. However, it is also conceivable for such a holding housing not to be provided, in which case the holding structure is then formed merely by the coupling partner with which plug contact is to be made. The coupling partner is preferably a connector which is arranged on a circuit board.

In one preferred embodiment of the invention, the protective apparatus has a moving protective element which is moved from a first position protecting the electrical contacts into a second position exposing the electrical contacts when the module is plugged into the holding structure. In this case, the protective element can be in the form of an element which can be displaced relative to the housing. Alternatively, the protective element cannot be displaced relative to the housing overall, but instead is designed to move into itself. To this end, it is in hinged or foldable form or is designed to roll into itself, in particular.

Preferably, the mechanical protective apparatus has at least one spring element which holds the moving protective element in the first position in the unplugged state and allows the protective element to move into the second position counter to a spring force during the plug-in operation. When the module is removed, the protective element is put back into the first position on account of the spring force, so that mechanical protection is provided for the contacts again.

The protective element is preferably a flat protective tongue which can be displaced longitudinally relative to the housing of the electronic module. In this case, at least part of the protective tongue preferably has a circulating concave profile for mechanically guiding spring elements on the protective tongue. The profile can also be used to guide the protective tongue in the housing of the module.

In one preferred form, the moving protective element has a stop element which comes into mechanical contact with a coupling partner during the plug-in operation, with the moving protective element being moved into the second position, which exposes the electrical contacts. By way of example, the stop element is formed by an angled-away part of the moving protective element which is ahead in the plug-in direction.

The moving protective element is preferably at a spacing from the electrical contacts in the first position and is arranged above them such that they are protected externally. The protective element thus preferably does not rest on the electrical contacts.

The inventive method for connecting an electronic module to a holding structure which is used to hold the electronic module and which has a coupling partner having electrical contacts provides the following steps:

a mechanical protective apparatus having a moving protective element which protects the external electrical contacts from mechanical contact when the module has not been inserted into the holding structure is provided; and the moving protective element is moved relative to the external electrical contacts when the electric module is plugged into the holding structure, so that the external electrical contacts are exposed and come into contact with associated electrical contacts on the coupling partner.

In this case, provision is preferably made for the moving protective element to be moved relative to at least one spring element interacting with the protective element during the plug-in operation.

BRIEF DESCRIPTION OF THE DRAWINGS

FIG. 3b shows a detail view of the protective element from FIG. 3a;

DESCRIPTION OF THE PREFERRED EMBODIMENTS

The background to the invention has been explained at the beginning with reference to FIGS. 8a, 8b and 9. Like these figures, the description below relates to an optoelectronic transceiver. However, a person skilled in the art will see that the disclosure of the invention can be used accordingly on any electronic modules which can be plugged into a holding structure, such as a housing, in plug-in fashion and which have external contacts.

Figure 1A:
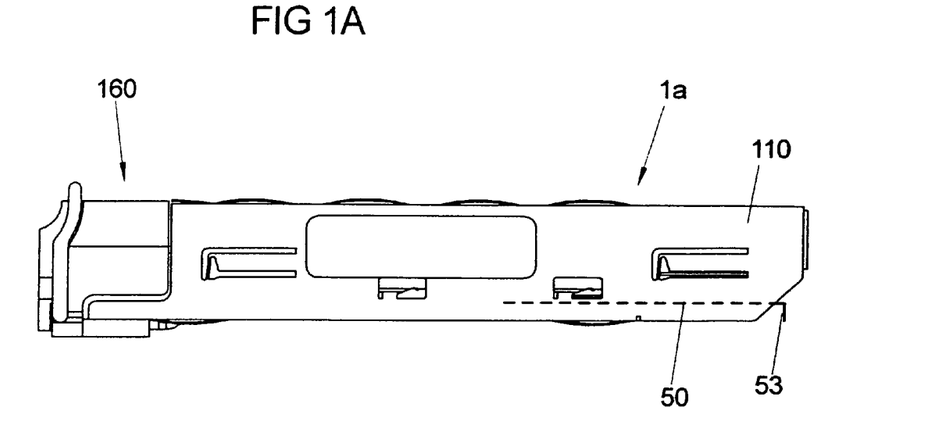
FIG. 1a shows a first exemplary embodiment of an electronic module provided with a mechanical protective apparatus in side view, with a protective element in the mechanical protective apparatus being in a first position.
Figure 1B:
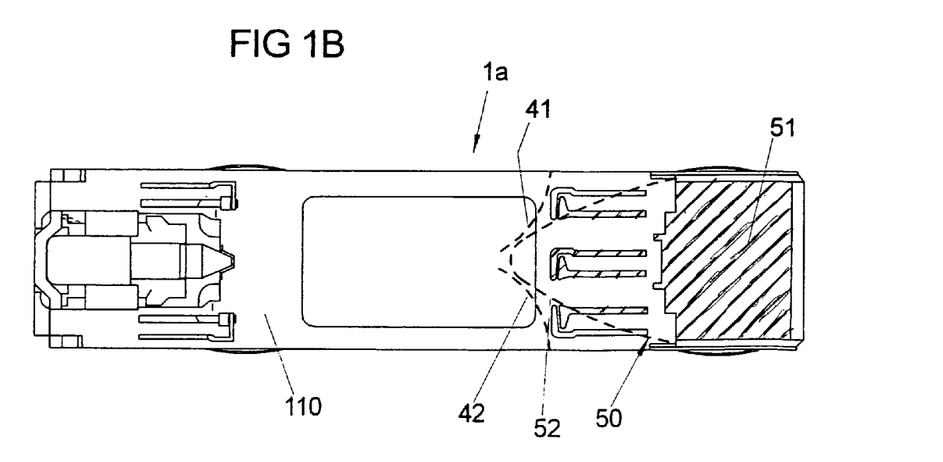
FIG. 1b shows the electronic module from FIG. 1a in a view from below.

The transceiver 1a shown in FIGS. 1a, 1b, 2a and 2b has a mechanical protective apparatus for external electrical contacts 130 which comprises a flat protective element 50, which can be displaced longitudinally relative to the housing 110, and spring elements 41, 42 interacting therewith. The protective element 50 is also referred to as "protective tongue" below. In a first position, which is shown in FIGS. 1a and 1b, the protective element 50 is below the electrical contacts 130, i.e. the protective element 50 protects the latter from direct contact or any substantial approach by another body. This safely prevents unwanted transfer of electrical charges.

In this case, the protective element 50 can alternatively be made of an electrically conductive material, an insulating material or a material which absorbs electromagnetic waves having the frequencies in question (particularly in the range from 1–10 GHz). The choice of material is dependent on the material of the housing 110 of the transceiver 1a, for example.

The external electrical contacts 130 allow contact to be made between the module 1a and other parts or a circuit board. They can be of any design, for example in the form of metallized contact pads or in the form of contact pins. The contacts 130 can be arranged in the form of a one-dimensional or two-dimensional array or else in another manner.

Figure 3A:
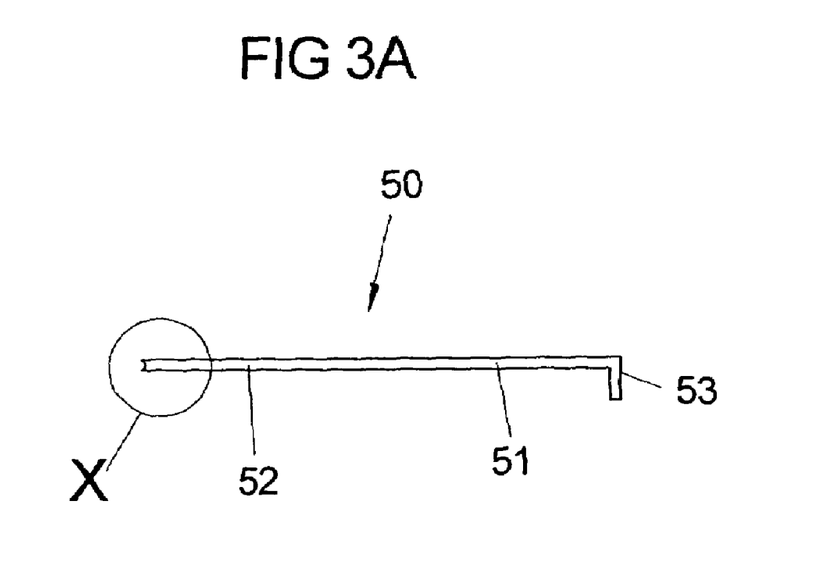
FIG. 3a shows the protective element in the mechanical protective apparatus in the module from FIGS. 1a, 1b, 2a and 2b in side view.

The protective tongue 50 is in the form of a flat part which can be displaced in the longitudinal direction in a cutout on the underside of the housing 110 and to this end is guided in guide structures (not shown) in the transceiver housing 110. The protective tongue 50 has a first, essentially rectangular region 51 which is used for protecting the electrical contacts 130. This essentially rectangular region 51 merges into a region 52 which tapers to a rounded point and is in contact with the two spring elements 41, 42. By way of example, the spring elements 41, 42 can be an integral part of the housing 110 (which is produced as a die-cast part, for example) or can alternatively be plastic or metal springs which are mounted on the housing. The springs 41, 42 project into the interior of the housing and then each bear against a limb of the tapering region 52 of the protective tongue 50.

Figure 3B:
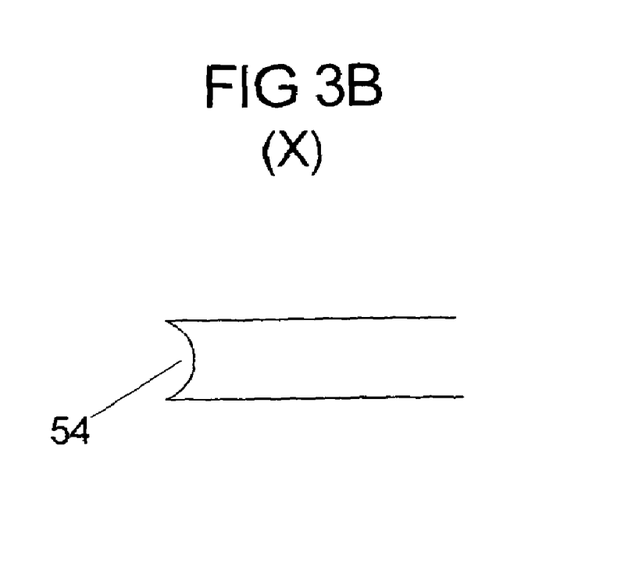

As the detail view in FIG. 3b shows, the protective tongue 50 preferably has a circulating, concave profile 54 which is used for mechanically guiding the springs 41, 42, which have an essentially circular cross section. In addition, the profile 54 can also be used to guide the protective tongue 50 itself in the housing 110.

In addition, the protective tongue 50 has a stop element 53 which is formed in a simple manner by a region 53 of the protective tongue 50 which is angled away through 90° at the end. As FIG. 1a shows, the stop element 53 projects slightly out of the housing 110.

Figure 1C:
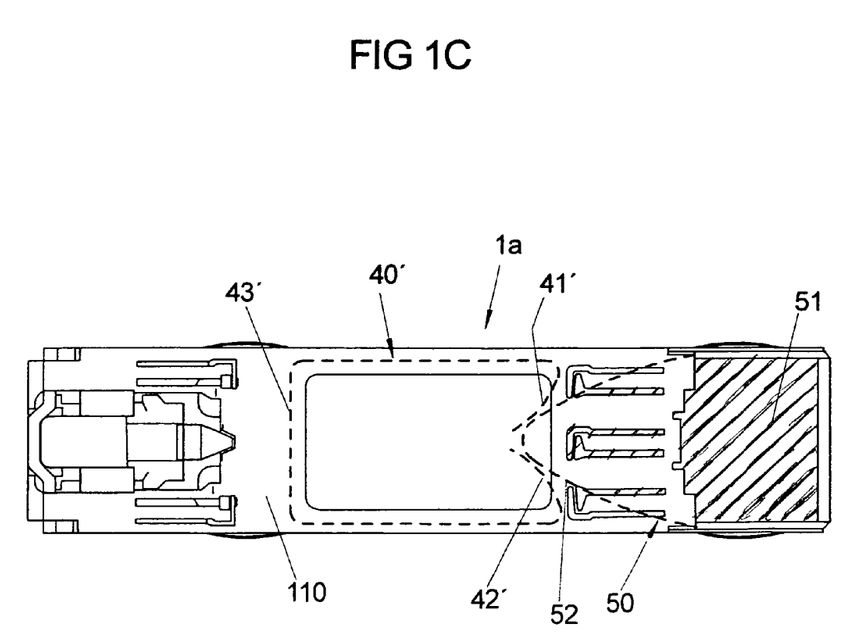
FIG. 1c shows an electronic module corresponding to FIGS. 1a and 1b in a view from below, with an alternative embodiment of a spring element in the mechanical protective apparatus being provided.

It will be pointed out that, in the case of spring elements which are in the form of separate parts, provision can likewise be made for the spring elements not to be connected to the housing, but rather merely to be inserted into it or arranged in it. A corresponding alternative embodiment is shown in FIG. 1c. A U-shaped spring 40' having two limbs is provided whose ends are adjoined by two inwardly bent resilient portions 41', 42' which come into contact with the protective element 50. In this case, the base 43' of the spring 40' is supported on a stop (not shown) in the housing 110, which is formed by inwardly projecting structures of the housing 110, for example. The embodiment with a spring merely inserted is particularly advantageous when a metal housing is used, since no separate connection is required between the spring and the housing.

It will also be pointed out that the housing 110 has a stop (not shown) for the protective element 50, and this stop prevents the protective element 50 from falling out of the housing.

Figure 2A:
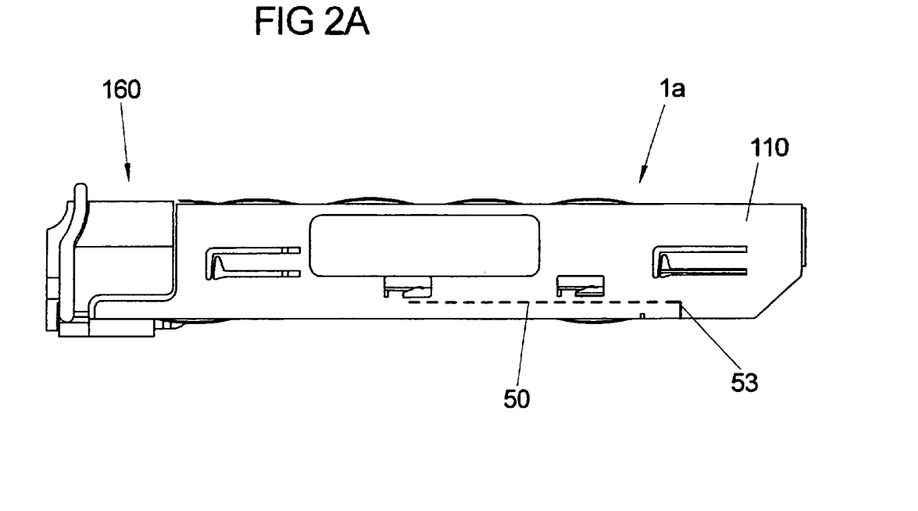
FIG. 2a shows the electronic module from FIG. 1a in side view, with the protective element in the mechanical protective apparatus being in a second position.
Figure 2B:
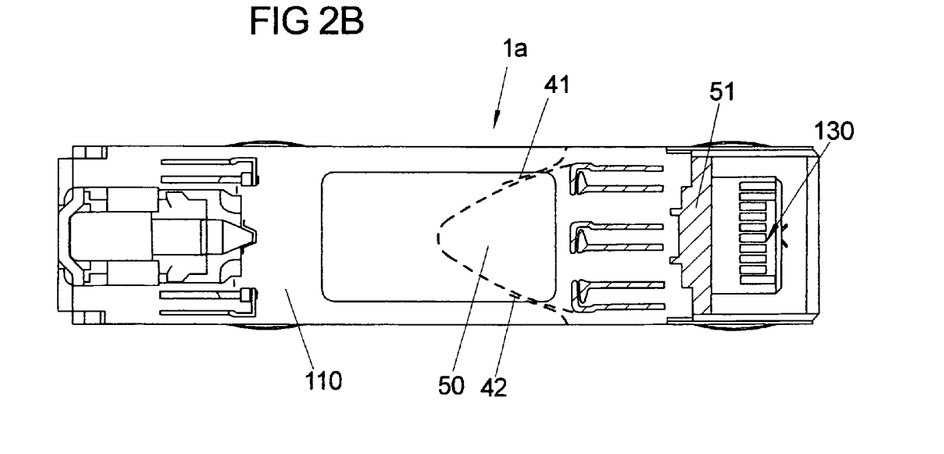
FIG. 2b shows the electronic module from FIG. 2a in a view from below.

FIGS. 2a and 2b show the protective tongue 50 in the transceiver 1a in a second position, in which the rectangular region 51 of the protective tongue has been displaced by the electrical contacts 130 such that they are now freely accessible for making contact with an electrical connector corresponding to the connector 20 in FIG. 9. This is done automatically by virtue of the stop element 53 hitting the connector (corresponding to the connector 20 in FIG. 9) fitted on a printed circuit board, and consequently being pushed away by the electrical contacts 130 on the transceiver, when the transceiver 1a is plugged into a holding structure, which is a metal housing in line with the housing 30 in FIG. 9, in particular.

When the protective tongue 50 is displaced, the springs 41, 42 are deflected, cf. FIG. 2b, so that a retroactive spring force builds up which ensures that the protective tongue 50 slides in front of the electrical contacts 130 again when the transceiver 1a is removed.

In alternative embodiments of the protective element, the protective element is not in the form of an element which can be displaced relative to the housing 110 overall, but rather is in the form of an element which can fold or roll into itself.

In the exemplary embodiment in FIGS. 4a, 4b, 5a and 5b, a protective element 60 in a transceiver 1b is in the form of a foldable element which comprises a plurality of laths or bars 61 which run transversely with respect to the longitudinal direction of the transceiver 1b and are connected to one another such that they can tilt on their longitudinal side. In this context, articulated connections 61 can be provided. Similarly, the protective element 60 can have grooves or impressions 61 around which the individual bars 62 of the element are hinged.

Figure 4A:
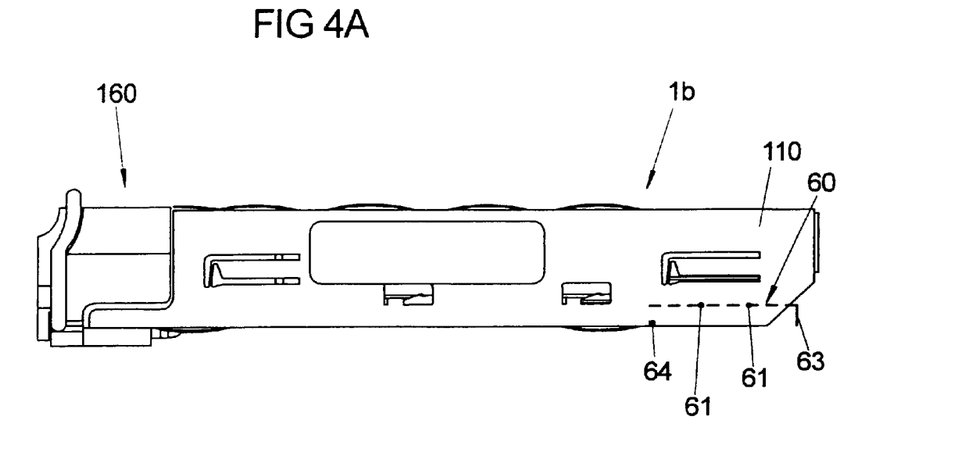
FIG. 4a shows a second exemplary embodiment of an electronic module having a mechanical protective apparatus in side view, with the mechanical protective apparatus having a foldable protective element which is in a first folding state.
Figure 4B:
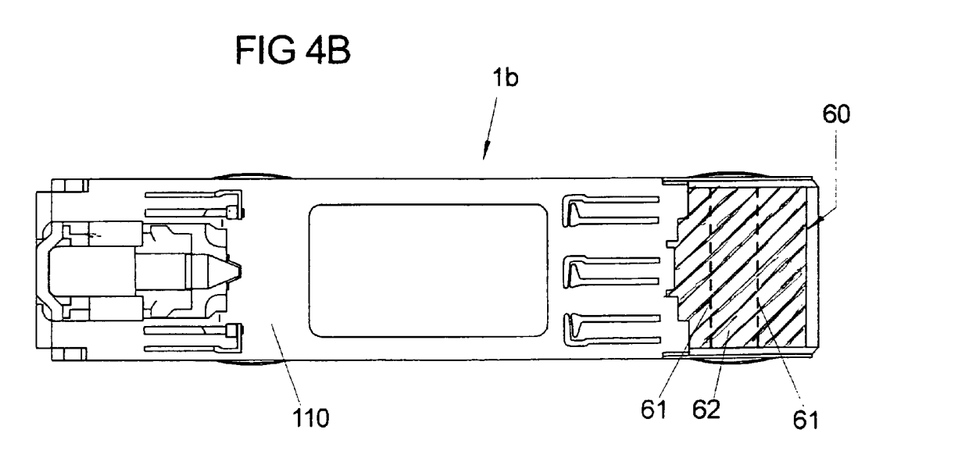
FIG. 4b shows the electronic module from FIG. 4a in a view from below.
Figure 5A:
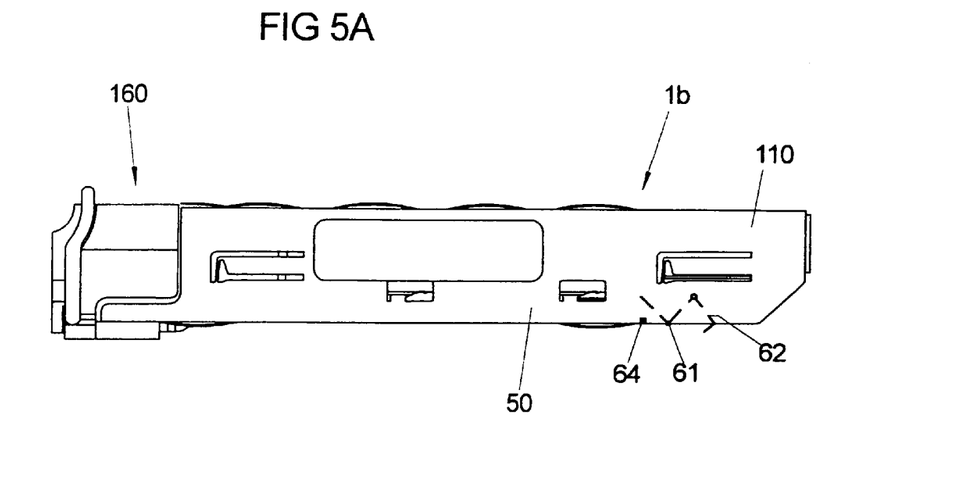
FIG. 5a shows the electronic module from FIG. 4a, with the foldable protective element being in a second folding state.
Figure 5B:
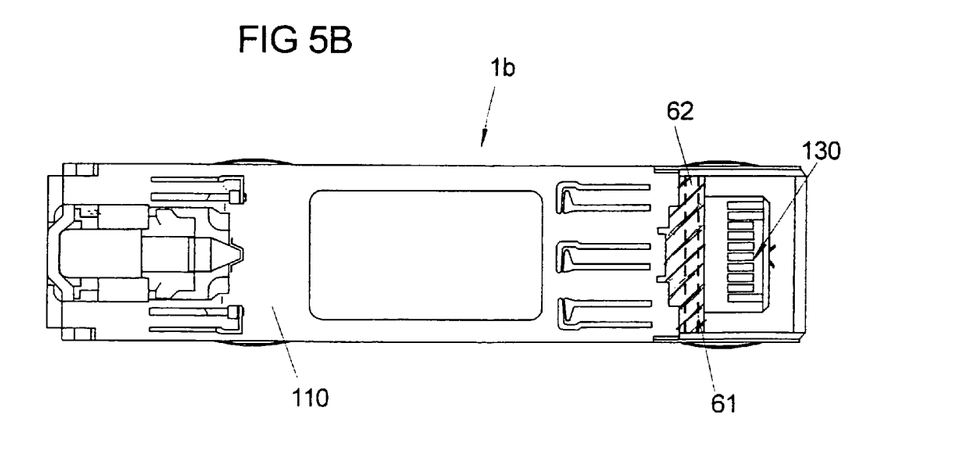
FIG. 5b shows the electronic module from FIG. 5a in a view from below.

While FIGS. 4a and 4b show the foldable element in a first position, in which the foldable element protects the electrical contacts 130, the foldable element 60 in FIGS. 5a and 5b is shown in a second position, in which the foldable element 60 has been folded into itself and accordingly exposes the electrical contacts 130. A hinge mechanism has been provided.

To initiate folding of the protective element 60, it is again possible to provide a stop element 63, for example, which hits a connector fitted on a printed circuit board when the module 1b is plugged in. The individual bars 62 of the protective element 60 then fold together. In this case, provision can be made for the protective element 60 to be made of a flexible material which ensures that the protective element 60 folds in front of the series of contacts 130 again when the transceiver 1b is removed.

It will be pointed out that, in this exemplary embodiment, that end 64 of the foldable protective element 60 which is remote from the contacts 130 is firmly connected to the housing 110 of the transceiver 1b, cf. FIGS. 4a and 5a.

In the exemplary embodiment in FIGS. 6a, 6b, 7a and 7b, a protective element 70 in a transceiver 1c is provided which can likewise move into itself. The protective element 70 is made of a flexible material which protects the electrical contacts 130 in the unplugged state shown in FIGS. 6a and 6b. When the transceiver 1c is plugged in, the protective apparatus 70 rolls back and exposes the electrical contacts, cf. FIGS. 7a and 7b. To initiate rolling-in of the protective element 70, the protective element can be provided with an end 71 which is rounded off at the top, projects out of the housing 110 and hits the coupling partner when the transceiver 1c is plugged in, the protective element 70 being rolled in upward as the plug-in operation continues.

Figure 6A:
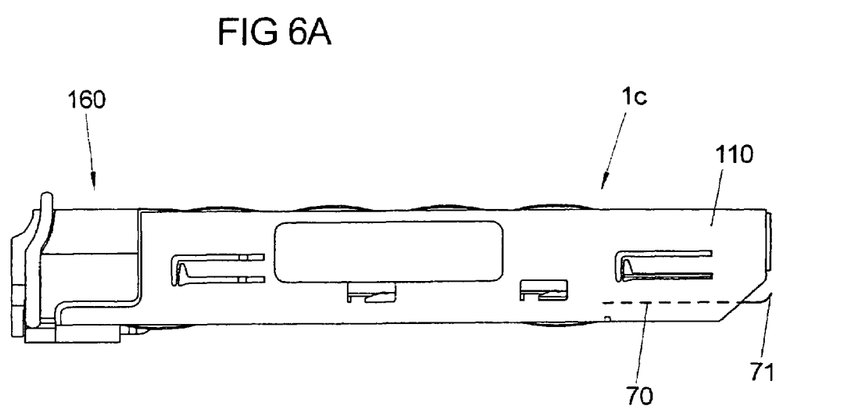
FIG. 6a shows a third exemplary embodiment of an electronic module having a mechanical protective apparatus, with the mechanical protective apparatus having a roll-up protective element which is in a first position.
Figure 6B:
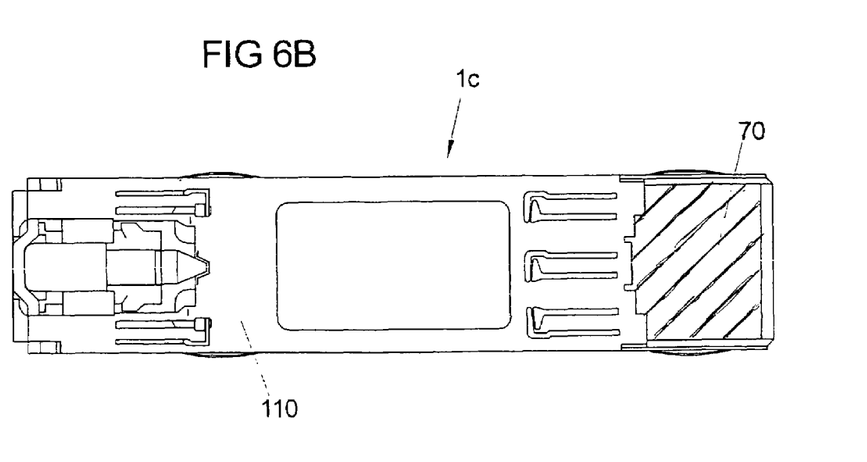
FIG. 6b shows the electronic module from FIG. 6a in a view from below.
Figure 7A:
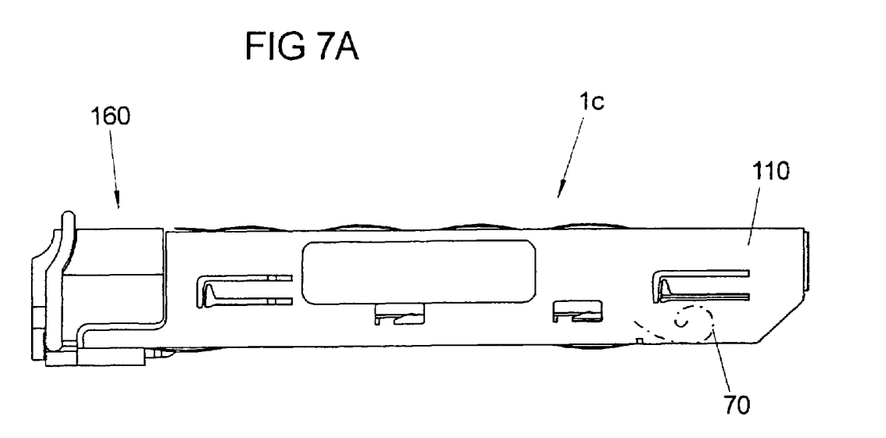
FIG. 7a shows the electronic module from FIG. 6a, with the roll-up protective element being in a second position.
Figure 7B:
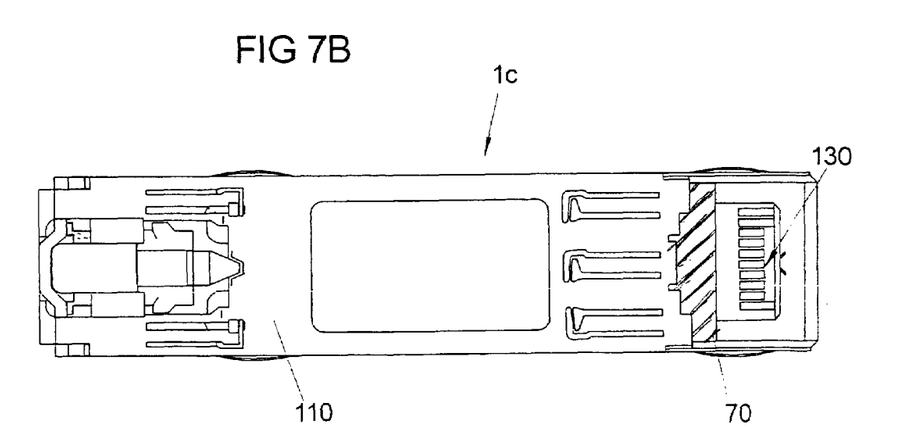
FIG. 7b shows the electronic module from FIG. 7a in a view from below.

On account of the use of a flexible material, the protective element 70 positions itself in front of the contacts 130 to be protected again when the transceiver is removed.

Implementation of the invention is not limited to the exemplary embodiments illustrated above, which should be understood merely by way of example. A person skilled in the art will see that numerous alternative variant embodiments exist which make use of the disclosure defined in the subsequent claims, despite departing from the exemplary embodiments described. By way of example, a wide variety of embodiments of a protective element which can be displaced relative to the housing 110 and also guidance of said protective element in the housing can be provided. Similarly, a wide variety of spring mechanisms which interact with a displaceable protective element can be provided. In addition, hinge mechanisms or rolling mechanisms which are different than in the exemplary embodiments in FIGS. 4–7, for example, can be provided.

We claim:

1. A plug-in electronic module for plugging into a holding structure having a coupling partner with an electrical contact, the electronic module comprising:
   a housing;
   an electronic component configured in said housing;
   at least one external electrical contact connected to said electronic component, said external contact being fixed relative to said housing, said external electrical contact configured for contacting the electrical contact on the coupling partner during a plug-in operation in which the electronic module is plugged into the holding structure; and
   a mechanical protective device for protecting said electrical contact from mechanical contact when the electronic module is not plugged into the holding structure, said protective device exposing said electrical contact when the electronic module is plugged into the holding structure such that said electrical contact comes into contact with the electrical contact on the coupling partner;
   said protective device including a moving protective element being displaceable relative to said housing and being configured for moving between a first position and a second position;
   said electrical contact being protected when said moving protective element is in said first position;
   said electrical contact being exposed when said moving protective element is in said second position;
   said moving protective element moving from said first position to said second position when the electronic module is plugged into the holding structure, wherein the moving protective element retracts to a position at least partially within the housing when moving from the first position to the second position.

2. The module according to claim 1, wherein said protective element is a flat protective tongue that is displaceable longitudinally relative to said housing.

3. The module according to claim 2, wherein at least part of said protective tongue has a circulatory concave profile for mechanically guiding said spring element on said protective tongue.

4. The module according to claim 1, further comprising:
   at least one spring element for holding said moving protective element in said first position in an unplugged state;
   said spring element allowing said protective element to move into said second position counter to a spring force during said plug-in operation.

5. The module according to claim 4, wherein said spring element is formed integral with said housing.

6. The module according to claim 4, wherein spring element is a separate part that is mounted on said housing or inserted into said housing.

7. The module according to claim 1, wherein said moving protective element includes a stop element for mechanically contacting the coupling partner during said plug-in operation such that said moving protective element is moved into said second position and said electrical contact is exposed.

8. The module according to claim 7, wherein:
   said moving protective element includes an end with an angled-away part forming said stop element; and
   said angled away part is a first part of said moving protective element touched by the holding structure during said plug-in operation.

9. The module according to claim 1, wherein said moving protective element is moveable into itself and has an end connected firmly to said housing.

10. The module according to claim 1, wherein said moving protective element is made of an electrically conductive material.

11. The module according to claim 1, wherein said moving protective element is made of an insulating material.

12. The module according to claim 1, wherein said moving protective element is made of a material that absorbs electromagnetic waves.

13. The module according to claim 1, wherein said moving protective element is spaced apart from said electrical contact in a first position.

14. The module according to claim 1, wherein said electronic component includes an optoelectronic transmitter, an optoelectronic receiver, or an optoelectronic transceiver.

15. The module according to claim 1, wherein the moving protective element is configured to engage a portion of the holding structure, wherein an insertion force is applied to the moving protective element by the holding structure when the electric module is plugged in to the holding structure thereby moving the moving protective element into the second position.

16. The module according to claim 1, wherein at least a portion of the moving protective element is configured to be received within the housing when the electronic module is plugged into the holding structure thereby exposing the electronic contact.

17. The module according to claim 1, further comprising at least one spring element for holding said moving protective element in said first position in an unplugged state, said spring element allowing said protective element to move into said second position counter to a spring force during said plug-in operation.

18. The module according to claim 1, wherein a first end of the moving protective element remains stationary and fixed to the housing as the protective element retracts to a position at least partially within the housing when moving from the first position to the second position.

19. The module according to claim 1, wherein said moving protective element is configured to roll up over itself during said plug-in operation to expose said electrical contact.

20. A plug-in electronic module for plugging into a holding structure having a coupling partner with an electrical contact, the electronic module comprising:
   a housing;
   an electronic component configured in said housing;
   at least one external electrical contact connected to said electronic component, said external electrical contact configured for contacting the electrical contact on the coupling partner during a plug-in operation in which the electronic module is plugged into the holding structure; and
   a mechanical protective device for protecting said electrical contact from mechanical contact when the electronic module is not plugged into the holding structure, said protective device exposing said electrical contact when the electronic module is plugged into the holding structure such that said electrical contact comes into contact with the electrical contact on the coupling partner;

said protective device including a moving protective element configured for moving between a first position and a second position, said moving protective element being moveable into itself and having an end connected firmly to said housing, and said moving protective element being a foldable element that folds together during said plug-in operation to expose said electrical contact;

said electrical contact being protected when said moving protective element is in said first position;

said electrical contact being exposed when said moving protective element is in said second position; and said moving protective element moving from said first position to said second position when the electronic module is plugged into the holding structure.

21. The module according to claim 20, wherein:
said foldable element includes a plurality of bars running transversely with respect to a longitudinal direction of the module;
said plurality of bars define a longitudinal side and
said plurality of bars are connected together for enabling tilting along said longitudinal side.

22. The module according to claim 20, wherein said moving protective element is a roll-up part configured for rolling up during said plug-in operation to expose said electrical contact.

23. A method for connecting an electronic module to a holding structure for holding the electronic module, the method which comprises:

providing the electronic module with an electronic component and at least one external electrical contact connected to the electronic component;

providing the electronic module with a mechanical protective device having a moving protective element that protects the external electrical contact from mechanical contact when the electronic module is not inserted into the holding structure; and moving the moving protective element against a bias force of a spring element and relative to the external electrical contact when the electric module is plugged into the holding structure such that the external electrical contact is exposed and contacts the electrical contact on the coupling partner, wherein an insertion force is applied to the moving protective element by the holding structure when the electric module is plugged in to the holding structure thereby moving the moving protective element into an interior portion of a housing of the electronic module.

24. The method according to claim 23, which further comprises moving the moving protective element relative to at least one spring element interacting with the protective element during a plug-in operation.

25. The method according to claim 23, wherein the moving protective element is received at least partially into a housing of the electronic module when the moving protective element is moved relative to the external electrical contact.

* * * * *